United States Patent [19]

Yung

[11] Patent Number: 4,908,525
[45] Date of Patent: Mar. 13, 1990

[54] CUT-ONLY CMOS SWITCH FOR DISCRETIONARY CONNECT AND DISCONNECT

[75] Inventor: Michael W. Yung, Los Angeles, Calif.

[73] Assignee: The United States of America as represented by the Secretary of the Air Force, Washington, D.C.

[21] Appl. No.: 307,372

[22] Filed: Feb. 3, 1989

[51] Int. Cl.[4] .......................................... H03K 17/22
[52] U.S. Cl. ............................. 307/202.1; 307/441; 307/446; 307/451; 307/246; 307/303.2
[58] Field of Search ................. 307/202.1, 441, 443, 307/446, 448, 451, 465, 468–469, 219, 246, 303.2; 365/200

[56] References Cited

U.S. PATENT DOCUMENTS

| | | |
|---|---|---|
| 4,092,733 | 5/1978 | Coontz et al. ............... 365/200 |
| 4,532,607 | 7/1985 | Uchida .................. 307/202.1 X |
| 4,543,594 | 9/1985 | Mohsen et al. ........... 307/202.1 X |
| 4,546,455 | 10/1985 | Iwahashi et al. ............ 365/200 |
| 4,577,123 | 3/1986 | Van Den Crommenacker et al. ............................ 307/446 |
| 4,605,872 | 8/1986 | Rung ....................... 307/465 |
| 4,613,959 | 9/1986 | Jiang ....................... 365/200 |
| 4,614,881 | 9/1986 | Yoshida et al. ............. 307/219 |
| 4,621,346 | 11/1986 | McAdams .................. 365/227 |
| 4,651,030 | 3/1987 | Mimoto .................. 307/468 X |
| 4,689,494 | 8/1987 | Chen et al. ............. 307/451 X |
| 4,691,078 | 9/1987 | Nishioka et al. ............ 174/68.5 |
| 4,791,319 | 12/1988 | Tagami et al. ............. 307/441 |
| 4,837,520 | 6/1989 | Golke et al. ............. 307/441 X |

OTHER PUBLICATIONS

Abbott et al., "Equipping a Line of Memories With Spare Cells", *Electronics*, Jul. 28, 1981, pp. 127–130.

Primary Examiner—David Hudspeth
Attorney, Agent, or Firm—Bernard E. Franz; Donald J. Singer

[57] ABSTRACT

To provide for improving the yield in the manufacture of wafer-scale integrated (WSI) or restructurable very-large-scale integrated (RVLSI) CMOS circuitry, a low power switch circuit, fabricated with standard CMOS process, provides both discretionary disconnect and connect capability, by a simple cut of one metal line to replace defective components with redundant good ones. The circuit uses either a reverse bias p-n junction or a transistor biased for sub-threshold conduction as a "pull-up" device, hence consuming very little power in either the original or the "cut" state. Large numbers of this switch can be incorporated into complex circuits without significantly loading the power supply.

5 Claims, 4 Drawing Sheets

CUT-ONLY CMOS SWITCH FOR DISCRETIONARY CONNECT AND DISCONNECT

BACKGROUND OF THE INVENTION

The present invention relates generally to a cut-only CMOS switch for discretionary connect and disconnect, and more particularly to wafer-scale integrated (WSI) or restructurable very-large-scale integrated (RVLSI) CMOS circuitry, wherein redundant circuit elements are used to replace defective ones so as to achieve a fully functional die.

U.S. patents of interest include U.S. Pat. No. 4,691,078 to Nishioka et al, which shows use of a cutting technique in an aluminum circuit in order to replace defective bits by redundant bits. Coontz et al, in U.S. Pat. No. 4,092,733, selectively connect and disconnect elements on a wafer. The device of this patent is described as useful in wafer scale integration involving redundant circuitry whereby defective elements are disabled and operable elements are substituted for them. Yoshida et al, in U.S. Pat. No. 4,614,881, describe a CMOS switch for redundancy substitution on a semiconductor memory chip. The circuit of this patent is designed to reduce power consumption. McAdams, in U.S. Pat. No. 4,621,078, discloses a low power CMOS fuse circuit; and Rung, in U.S. Pat. No. 4,605,872, is concerned with a programmable CMOS disconnect circuit in a redundant element system. A pull-up circuit is shown in Van Den Crommenacher et al U.S. Pat. No. 4,577,123.

SUMMARY OF THE INVENTION

An objective of the invention is to provide for improving the yield in the manufacture of wafer-scale integrated (WSI) or restructurable very-large-scale integrated (RVLSI) CMOS circuitry.

The invention relates to a low power switch circuit, fabricated with standard CMOS process, that provides both discretionary disconnect and connect capability, by a simple cut of one metal line to replace defective components with redundant good ones. The circuit uses either a reverse bias p-n junction or a transistor biased for sub-threshold conduction as a "pull-up" device, hence consuming very little power in either the original or the "cut" state. Large numbers of this switch can be incorporated into complex circuits without significantly loading the power supply.

The invention has advantages compared to existing schemes of discretionary disconnect and connect in three respects: flexibility, simplicity, and low power.

1. Compared to all disconnect schemes, this invention provides extra reconfiguration flexibility by providing both disconnect and connect capabilities while requiring only a simple "cut" operation. This operation can be performed by many possible means such as an ultrasonic probe, laser, or focused ion beam.
2. Existing connect schemes, such as the anti-fuse, require expensive, special pre-processing on the wafers or a sophisticated fusing process. A scheme such as direct-write-on resist using an electron beam requires extra processing, which is both expensive and defect-inducing.
3. Existing approaches that combine disconnect-only technology and switch circuitry usually consume at least 100 $\mu$W of power per switch. This may be acceptable in VLSI circuitry with less than 10,000 switches per die, but not with WSI circuitry such as a 3-D computer. The switch described herein consumes less than 0.1 $\mu$W per switch. A million of them will still consume less than one watt. Other approaches achieving a similar power consumption level would require special processes such as the non-doped poly-resistor, non-standard in a CMOS process.

This switch can be applied to any large scale CMOS circuitry which requires disconnect and connect capabilities, especially WSI circuitry such as in a 3-D computer. Currently, a 128 × 128 array 3-D computer is to be built, and one of the most critical issues is circuit yield. If this invention is applied, it will make possible a redundancy scheme that increases the circuit yield from 40% to over 90%. The yield improvement will even be more drastic for a larger array. The successful development of the 3-D computer will revolutionize space computer technology because of its high processing rate with low volume and power consumption.

DETAILED DESCRIPTION

In wafer-scale integrated (WSI) or restructurable very-large-scale integrated (RVLSI) CMOS circuitry, redundant circuit elements are used to replace defective ones so as to achieve a fully functional die. The CMOS switch circuit of the subject invention provides a simple approach to both disconnect the defective circuit element(s) and connect the good one(s) in a single operation of cutting a metal line. The switch uses either a reverse bias p-n junction or a transistor biased for sub-threshold conduction as a "pull-up" device, hence consuming very little power (<0.1 $\mu$W) in either the original or the "cut" state. Large numbers (>10,000) of this switch can therefore be incorporated into complex circuits such as WSI circuitry without significantly loading the power supply.

Figure 1:
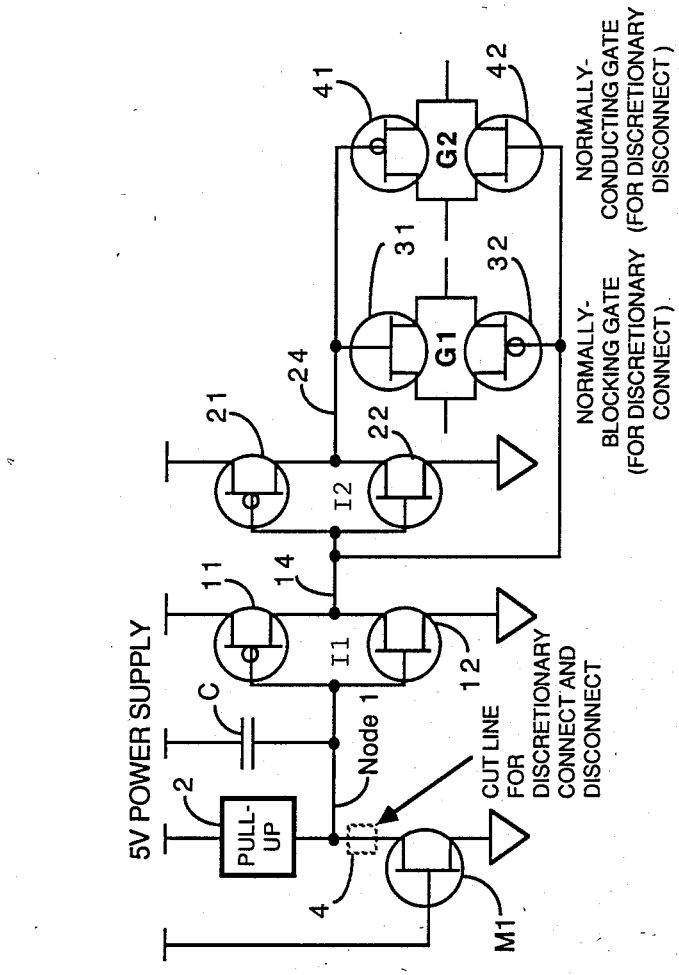
FIG. 1 is a schematic circuit diagram of a switch with a cut line for discretionary connect and disconnect.

A circuit schematic of the switch is shown in FIG. 1. The heart of the switch is formed by a "pull-up" device 2 in series with an N-channel MOS transistor M1 biased ON. A capacitor C is connected in parallel with the pull-up device 2 between the +5-volt power supply and a node 1. Between node 1 and the drain of transistor M1 there is provided a cut line 4 for discretionary connect and disconnect. The source of transistor M1 is connected to ground.

Two inverters I1 and I2 are connected in tandem between node 1 and two transmission gates G1 and G2. Inverter I1 comprises a P-channel transistor 11 in series with an N-channel transistor 12, with the gates connected as the input from node 1, the drain of transistor 11 connected to the 5V power supply, the source of transistor 11 and the drain of transistor 12 connected together as the output to a node 14, and the source of transistor 12 connected to ground. The inverter I2 comprises transistors 21 and 22 similarly connected between input from node 14 and an output to a node 24. The gate G1 comprises an N-channel transistor 31 and a P-channel transistor 32, with the gates connected respectively to nodes 24 and 14. The gate G2 comprises a P-channel transistor 41 and an N-channel transistor 42, with the gates connected respectively to nodes 24 and 14. The source and drain terminals of the gates G1 and G2 are connected in parallel for connection in circuit not shown.

The "pull-up" is a high resistance device 2, either a reverse-biased diode or a P-channel MOS transistor designed to have sub-threshold leakage current only. This high resistance "pull-up" is the key for low power consumption. Node 1 is normally "low". The two inverters I1 and I2 provide the necessary control to transmission gates G1 and G2, so that the latter are normally blocking and conducting respectively .There can be as many of these two types of transmission gates as needed by the circuitry to be connected and disconnected. A reversal of state from blocking to conducting for gate G1, and from conducting to blocking for gate G2, can be achieved by a simple cut of the cutline 4 between transistor M1 and the pull-up device 2 as shown. Node 1 will be "pulled-up" to the supply voltage slowly and will stay at that voltage by the effect of the capacitor C. Any change of voltage at the circuit to be connected or disconnecetd will be capacitively decoupled from Node 1 by the inverter I1, hence effecting the discretionary connect and/or disconnect actions.

Figure 2:
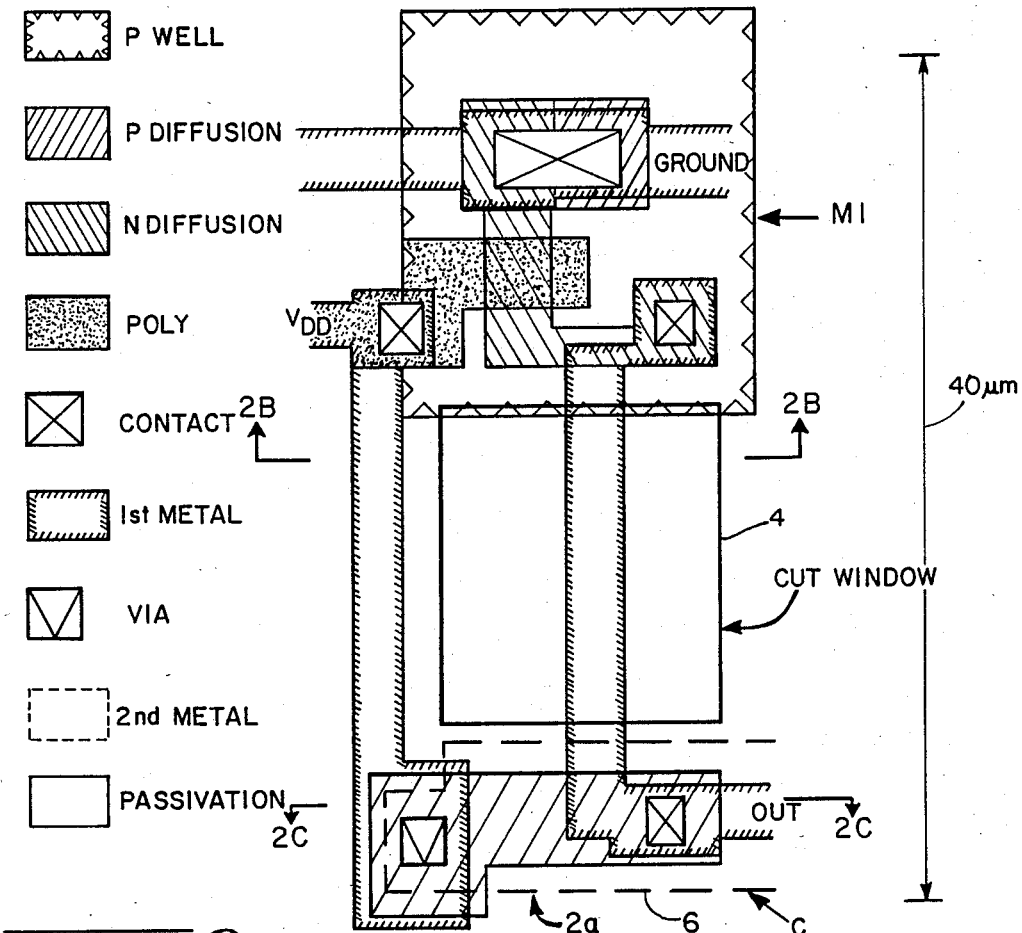
FIGS. 2 and 2A are a layout example and a corresponding schematic circuit diagram of a portion of the switch of FIG. 1 using a diode as a pull-up device.
Figure 2A:
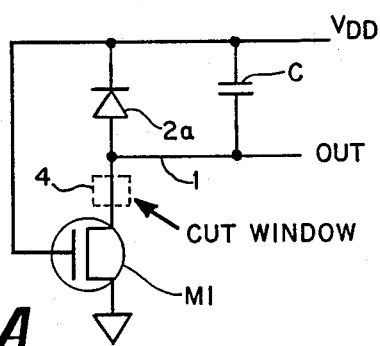
Figure 2B:
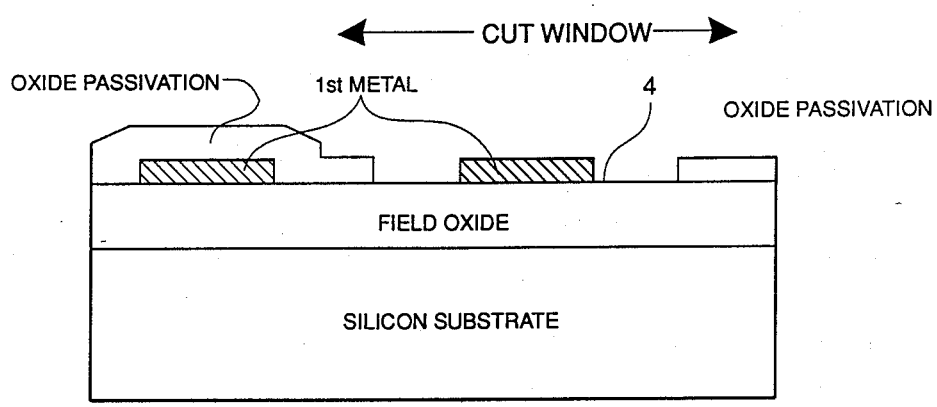
FIGS. 2B and 2C are cross section views taken along lines 2B—2B and 2C—2C respectively of FIG. 2.
Figure 2C:
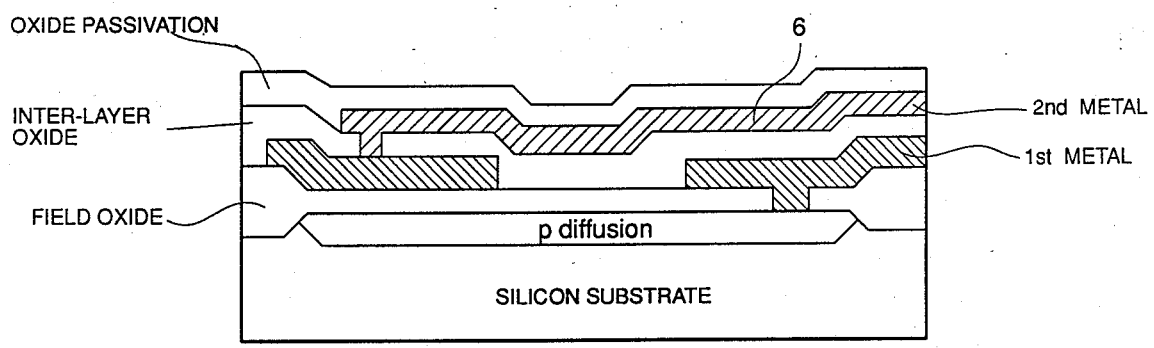
Figure 3:
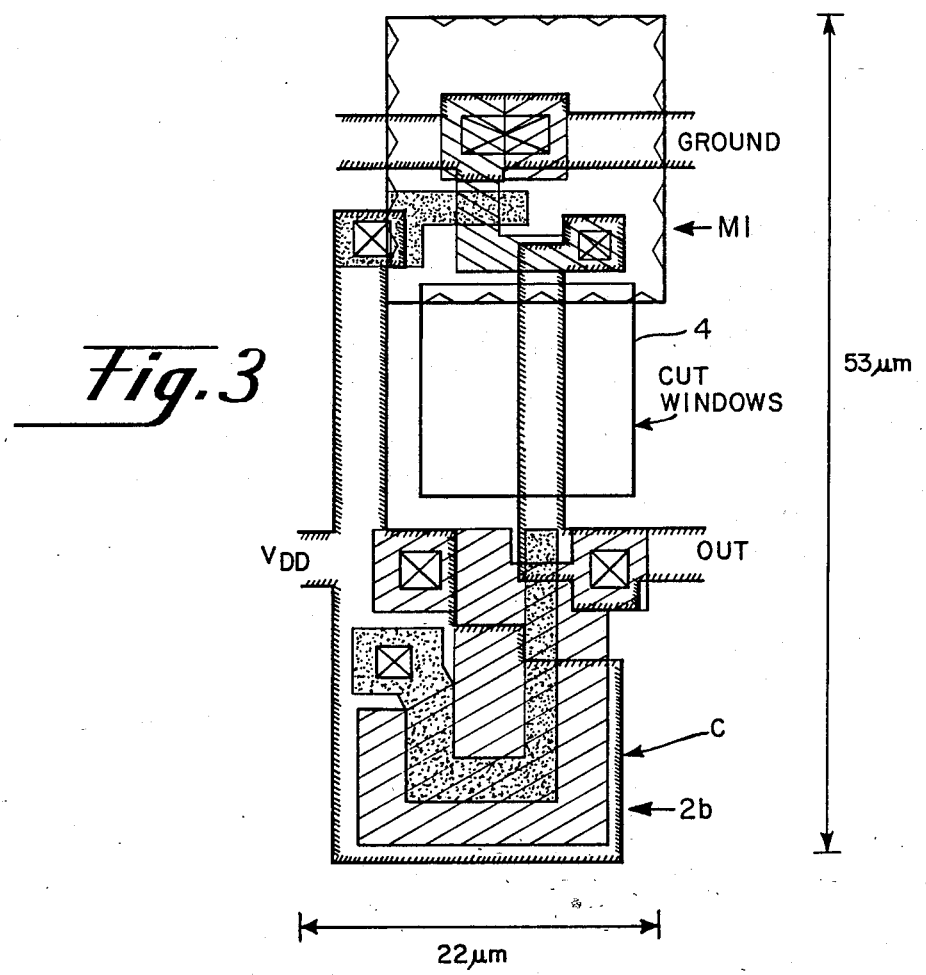
FIGS. 3 and 3A are a layout example and a corresponding schematic circuit diagram of a portion of the switch of FIG. 1 using a transistor as a pull-up device.
Figure 3A:
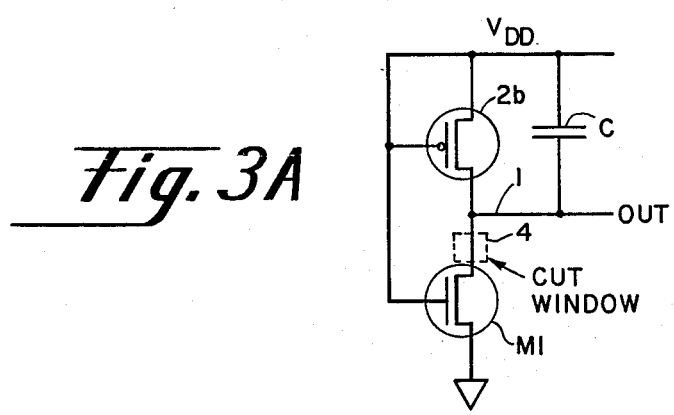

A layout example of a portion of the switch consisting of transistor M1, capacitor C, and a diode 2a used for the pull-up device 2 is shown in FIG. 2, corresponding to a schematic circuit diagram shown in FIG. 2A. A similar example with a P-channel transistor 2b as the pull-up device 2 is shown in FIGS. 3 and 3A. For the embodiment of FIGS. 2 and 2A, cross section views are shown in FIGS. 2B and 2C, taken along lines 2B—2B and 2C—2C respectively of FIG. 2. The key at the left of FIG. 2 applies to both of FIGS. 2 and 3. The layout is on a silicon substrate not shown in FIGS. 2 and 3, but partially shown in FIGS. 2B and 2C broken away at the bottom and sides. The processing provides a P well, P diffusion, N diffusion, polysilicon, contacts, a first metal layer, a via (FIG. 2), a second metal layer 6 for the capacitor, and passivation, in accordance with standard practice in the CMOS art.

The diode 2a (FIGS. 2, 2A and 2C) acting as the pull-up device is readily available between the P+-diffusion and the N-substrate (or N-well) of a bulk CMOS process. The diode leakage current is very small, in the order of $10^{-13}$ to $10^{-11}$ amperes. If Node 1 has other unwanted leakage paths to ground, this current may not be large enough to pull up Node 1 to the supply voltage. The P-channel transistor 2b (FIGS. 3 and 3A) with sub-threshold leakage will overcome this problem. But its realization is not as straightforward. The P transistor in the normal CMOS process would have very little sub-threshold current (comparable to diode leakage) when the gate is shorted to the source. To increase this current to the $10^{-9}$ ampere range, two approaches are taken. First is to have a slightly shorter transistor gate. Secondly, the transistor 2b will be laid out in a U-shape with the drain node (i.e. Node 1) on the outside bend. Both approaches will increase the leakage current due to the drain induced barrier lowering effect.

The capacitor C consists of two components. First is the junction capacitance between any P+ diffusion in Node 1 and the N-substrate underlying. Secondly, is the capacitance provided by a metal plate 6 (FIG. 2) connected to the supply voltage over the area occupied by Node 1. This gives a "sandwiched" structure and should provide solid protection to Node 1 from stray capacitance coupling.

The cross section view of FIG. 2B shows a section through the cut window 4 with the metal lead from the transistor M1 to the diode 2a and the capacitor C. This view also shows a section through the metal lead from the power supply, and the transistor M1 is in the background without sectioning.

The cross section view of FIG. 2C shows a section through the diode 2a and the capacitor C.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A switch circuit forming part of an integrated CMOS semiconductor circuit device comprising an N-channel CMOS transistor in series with a pull-up device having a high impedance, a capacitor in parallel with the pull-up device between a power supply terminal and a first node, said transistor having a drain electrode connected via a metal line to the first node, a gate electrode connected to the power supply terminal, and a source electrode connected to ground, so that the transistor is normally conducting and the first node is low at substantially ground potential, a cut window in said metal line so that by a cut of the metal line at said window the first node goes high to substantially the power supply potential via the pull-up device and is held high during operation via the capacitor;
   means coupling the first node to components, including redundant components which are normally blocked with the first node low, and in response to the first node going high defective components are replaced with redundant good ones.

2. A switch circuit according to claim 1, wherein said pull-up device is a diode connected with reverse bias.

3. A switch circuit according to claim 2, wherein the capacitor includes a metal plate connected to the power supply terminal insulatedly overlying an area occupied by the first node, which provides protection to the first node from stray capacitance coupling.

4. A switch circuit according to claim 1, wherein said pull-up device is a P-channel CMOS transistor having a slightly shorter than normal gate electrode laid out in a U-shape with a drain electrode on an outside bend and connected to the first node, and having gate and source electrodes connected to the power supply terminal.

5. A switch circuit according to claim 4, wherein the capacitor includes a metal plate connected to the power supply terminal insulatedly overlying an area occupied by the first node, which provides protection to the first node from stray capacitance coupling.

* * * * *